(12) United States Patent
Albinsson et al.

(10) Patent No.: US 6,417,744 B1
(45) Date of Patent: Jul. 9, 2002

(54) TRANSITION BETWEEN ASYMMETRIC STRIPLINE AND MICROSTRIP IN CAVITY

(75) Inventors: Björn Albinsson, Göteborg; Thomas Harju, Sävedalen, both of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/594,483

(22) Filed: Jun. 16, 2000

(30) Foreign Application Priority Data

Jun. 17, 1999 (SE) ............................................. 9902301

(51) Int. Cl.⁷ ............................................... H01P 5/08
(52) U.S. Cl. .......................................... 333/33; 333/246
(58) Field of Search ................................. 333/246, 247, 333/238; 174/52.4; 361/761; 257/664, 692, 698, 700

(56) References Cited

U.S. PATENT DOCUMENTS 5,218,230 A * 6/1993 Tamamura et al. ......... 257/691
5,294,751 A * 3/1994 Kamada ..................... 174/52.4
5,373,187 A * 12/1994 Sugino et al. .............. 257/664
5,982,250 A * 11/1999 Hung et al. ................... 333/26

FOREIGN PATENT DOCUMENTS

EP  0 563 873 A2  10/1993

* cited by examiner

Primary Examiner—Robert Pascal
Assistant Examiner—Stephen E. Jones
(74) Attorney, Agent, or Firm—Burns, Doane, Swecker & Mathis, L.L.P.

(57) ABSTRACT

The present invention relates to a multilayer printed circuit board arrangement which results in better matching between a stripline (9) and a microstrip (4) in a cavity (6). The solution comprises the use of an asymmetric stripline (9) where the electric field is tied primarily to the lower earth plane (10). This results in good matching at the transition to the microstrip (4), whose field is tied to the lower earth plane (10).

12 Claims, 1 Drawing Sheet

TRANSITION BETWEEN ASYMMETRIC STRIPLINE AND MICROSTRIP IN CAVITY

BACKGROUND

The present invention relates to a multilayer printed circuit board and more specifically to a transition between a symmetric stripline and microstrip in the cavity of such a board.

Many different sorts of multilayer printed circuit boards are known to the art. LTCC (Low Temperature Co-fired Ceramic) will be used hereinafter as an example, although it will be understood that the invention can also be applied in other types of multilayer printed circuit boards.

Briefly, multilayer printed circuit boards are manufactured in the following way. There is obtained on the basis of a printed circuit board design a drawing that contains necessary information, such as the number of layers, the appearance and dimensions of the patterns on the various layers, the locations at which different layers shall contact one another, and so on.

Each layer per se is rolled out from a ceramic mass to a predetermined thickness on a plastic film; this is a so-called tape. Different patterns are punched from these tapes in accordance with the design, these including the outer edges of the board, the marks that are later used to match the layers together, and holes for binding different layers together with so-called vias.

Subsequent to configuring the layers, the via holes are filled with a suitable conductive material. The patterns are then printed on each of the layers. A common method in this respect is to use screen-printing to correctly position the conductors. These conductors may consist of gold, silver or some other suitable conductive material. When the patterns are in place, the various layers are placed one upon the other until all layers are in position.

The whole of the printed circuit board is then placed under pressure, inserted into an oven and baked immediately (Co-fired) at a relatively low temperature, 700–800 degrees centigrade (Low Temperature), wherewith the ceramic mass is sintered and transformed to a ceramic. Subsequent to this curing or hardening process, it is usual to speak of layers instead of tapes.

In the case of applications for high frequency signals, particularly within the microwave field, it is not always possible to use traditional conductors, since this would result in unacceptable losses and disturbances. A normal requirement in the case of microwave signals is the presence of an earth plane above or beneath a conductor, this earth plane following the conductor. When a conductor only has an earth plane on one side it is called a microstrip. These strips are normally arranged so that they have the printed circuit board on one side and air or another dielectric on the other side. In other cases, it is desirable that the conductor is surrounded by both an upper and a lower earth plane, this conductor then being called a stripline. When the distances between a stripline and the earth planes are the same on both sides of the conductor, it is said that the stripline is symmetrical. When the distances are different, an asymmetric stripline is obtained. Although symmetric striplines are he most common, there are occasions when an asymmetric stripline is preferred. One advantage afforded by striplines is that radiation from the conductors is small when, e.g., transmitting signals in the microwave range in so-called stripline-mode, which is one reason why such signals are often transmitted in this way. Microstrips and striplines can be easily provided in multilayer printed circuit boards, and are consequently often used to this end. In order to enable conductors to be surrounded by earth planes, conductor planes and earth planes are normally disposed alternately in the printed circuit board.

It is possible to mount chips, for instance an MMIC (Monolithic Microwave Integrated Circuit), directly in a multilayer printed circuit board. This is achieved by placing the chip on the earth plane in a cavity and connecting the chip to the nearest signal carrying layers with the aid of so-called bonding wires. This is shown in FIG. 1, in which the chip has been connected to a pair of microstrips in a known manner. The transition between the symmetric striplines and the microstrips, however, is not fully satisfactory, since the electric field in the strip line is tied just as strongly to the upper earth plane as to the lower earth plane. This means that when the upper earth plane suddenly disappears, it becomes "heavy going" for the conductor and thus results in a poor match.

This matching problem does not apply to signals that have sufficiently low frequencies. On the other hand, the problem does arise in the case of high frequency signals, for instance RF signals. The reason why these signals are nevertheless still transmitted in so-called stripline mode is because it reduces radiation from the conductors, among other things.

SUMMARY

The present invention addresses the problem of improving matching in a transition between a stripline and a microstrip in a cavity, preferably in a multilayer printed circuit board that has chips mounted therein.

One object of the present invention is thus to provide a transition between stripline and microstrip in a cavity such that good matching will be obtained.

In brief, the present invention relates to an arrangement in which microstrip and stripline are asymmetrical instead of symmetrical. The electric field in the stripline will thus essentially be undisturbed downstream of the transition to the microstrip, since the field is tied to the adjacent earth plane.

The inventive arrangement is characterised by the features set forth in the accompanying Claim 1.

One advantage afforded by the solution to said problem is that transitions between stripline and microstrip in a cavity can be made simpler and with good matching. This enables multilayer printed circuit boards which have components mounted therein to be made more effective.

The invention will now be described in more detail with reference to preferred embodiments thereof and also with reference to the accompanying drawing.

DETAILED DESCRIPTION

Figure 1:
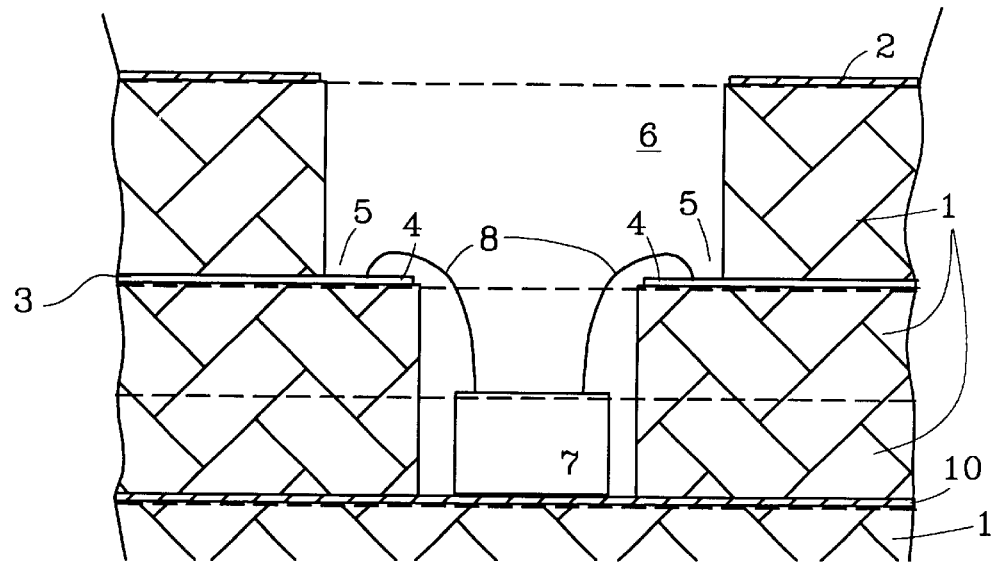
FIG. 1 is a cut-away side view of multilayer printed circuit board that has a transition between stripline and microstrip.

FIG. 1 is a cut-away side view of a multilayer printed circuit board. The reference numeral 1 identifies a number of layers, which need not necessarily have different thicknesses, on which a conductor 2, 3, 10 of some sort is normally mounted. These conductors 2, 3, 10 may, for instance, form an earth plane 2, 10 or a stripline 3, in this case a symmetrical stripline. A cavity 6 extends through the upper earth plane 2 and through a number of layers 1 down to the underlying earth plane 10. The cavity 6 narrows on at least one side of the stripline 3, which means that the stripline 3 transits in a microstrip 4 (that only has layers 1 (tape) on one side). The region in which the microstrip 4 is located is called a bonding shelf 5. Furthest down in the cavity 6 is a chip 7, which is normally connected directly to the earth plane 10. This chip 7 is connected to the microstrips 4 on the bonding shelves 5 by means of a number of so-called bonding wires 8.

The electric field in the symmetrical stripline 3 is connected equally harshly to both earth layers 2, 10, since the vertical distances between stripline 3 and respective earth planes 2 and 10 in FIG. 1 are essentially equal to one another. The microstrip 4 in the cavity 6 lacks the upper earth plane 2 and its field is therefore tied to the bottom earth plane 10. This results in a mismatch in the transition between the stripline 3 and the microstrip 4, which causes the performance of the entire board to be lower than it would otherwise be if the stripline 3 had been less dependent on the upper earth plane 2.

Figure 2:
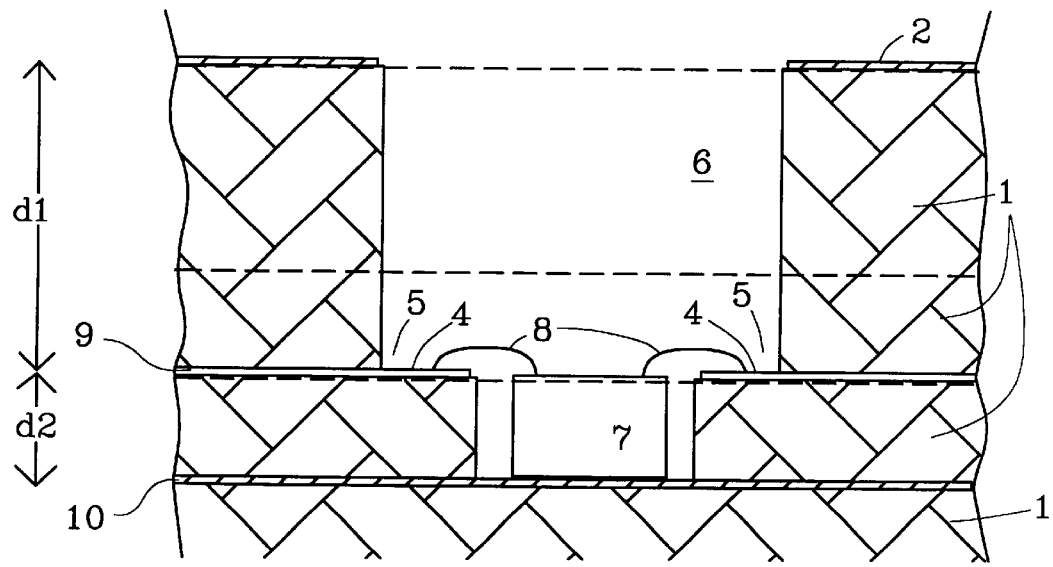
FIG. 2 is a view similar to that of FIG. 1 and shows the transition effected with the inventive arrangement.

FIG. 2 is a view similar to the view of FIG. 1 and shows the inventive transition. Similar to FIG. 1, there is shown a number of layers 1, two earth planes 2, 10, a cavity 6 with microstrips 4 on bonding shelves 5 and a chip 7 connected to the microstrips 4 by means of bonding wires 8. In the case of the illustrated inventive arrangement, the conductor includes an asymmetric stripline. This is achieved by arranging the stripline 9 so that the layer 1 between said stripline and the upper earthplane 2 is thicker than the layer 1 between the stripline 9 and the lower earth plane 10. The distance $d_1$ is thus greater than the distance $d_2$ in FIG. 2. Matching to the microstrip 4 in the cavity 6 is thus improved by virtue of the fact that the electric field is essentially tied to the lower earth plane 10 in this case, since the electric field of the microstrip is also tied to the lower earth plane 10.

The quality of the match is determined by the quotient $q=d_2/d_1$ between the distances $d_1$ and $d_2$ from the stripline 9 to the upper earth plane 2, $d_1$, and from the earth plane 10, $d_2$, respectively. In the case of the symmetrical transition shown in FIG. 1, where distances $d_1$ and $d_2$ are the same, the quotient $q=1$. On the other hand, in the case of the asymmetric transition in FIG. 2, where the distances $d_1$ and $d_2$ differ from each other, the aforesaid quotient will be $q<1$. Generally speaking, the smaller the quotient q, i.e. the greater the difference between the distances to respective earth planes, the better the match in the transition. However, the quotient q cannot be made arbitrarily small. Firstly, the stripline 9 must be disposed on a layer 1. The smaller the desired quotient q the more layers that are required, or the layers must be made thicker. The number of layers is normally limited by the thickness of the printed circuit board for design reasons and should not exceed a given value, or for economic reasons, since cost increases with the number of tapes (layers). Secondly, the losses in the transmission through the stripline 9 become greater with increasing asymmetry, which often results in the quotient q being limited in a downward sense. Thus, the quotient q is normally a compromise between economy, board thickness, stripline losses and transition matching. It is therefore not possible to give a general optimal value of the quotient q.

Because, in the inventive arrangement, matching between stripline 9 and microstrip 4 in said transition is improved, the signals pass more easily between the stripline and microstrip. This increases the effectiveness of the entire printed circuit board.

It will be understood that the invention is not restricted to the aforedescribed and illustrated embodiments thereof, and that modifications can be made within the scope of the accompanying Claims.

What is claimed is:

1. A transition between a stripline (9) and a microstrip (4) on a multilayer printed circuit board, wherein the board includes at least two layers and at least two earth planes, and wherein the board includes a cavity which extends through at least two layers, wherein the stripline (9) is arranged asymmetrically between the two earth planes such that the orthogonal distance (d1) to one earth plane is greater than a corresponding orthogonal distance (d2) to the other earth plane and the microstrip (4) is disposed in a same plane as the stripline (9) such that the microstrip (4) is separated from the other earth plane (10) by the corresponding orthogonal distance (d2).

2. The transition between the stripline (9) and the microstrip (4) of claim 1, wherein the distance (d1) to the one earth plane is at least twice as great as the corresponding distance (d2) to the other earth plane.

3. A multilayer printed circuit board comprising:
   a first layer;
   a first earth plane disposed on the first layer;
   a second layer;
   a second earth plane disposed on the second layer;
   an asymmetrical stripline between the first and the second layers;
   a cavity extending through the first earth plane and through at least the first layer; and
   a microstrip electrically connected to the asymmetrical stripline, wherein a first side of the microstrip is oriented towards the cavity and a second side of the microstrip is oriented towards the second earth plane;
   wherein the asymmetrical stripline is separated from the first earth plane by at least the first layer and is separated from the second earth plane by at least the second layer; and
   wherein a thickness of the first layer is greater than a thickness of the second layer.

4. The multilayer printed circuit board of claim 3, wherein the asymmetrical stripline is separated from the first earth plane by at least the first layer and a third layer.

5. The multilayer printed circuit board of claim 3, wherein the first layer and the second layer are ceramic layers.

6. The multilayer printed circuit board of claim 5, wherein the first layer and the second layer are low temperature co-fired ceramic layers.

7. The multilayer printed circuit board of claim 3, wherein a signal in the asymmetrical stripline produces a stronger coupling between the stripline and the second earth plane than between the stripline and the first earth plane.

8. The multilayer printed circuit board of claim 3, wherein the cavity extends through the first earth plane and through at least the first and second layers.

9. The multilayer printed circuit board of claim 8, wherein the asymmetrical stripline is configured as a plane substantially parallel to the second earth plane, the multilayer printed circuit board further comprising:
   a chip disposed upon the second earth plane, the chip being located between the second earth plane and the plane of the asymmetrical stripline; and
   bonding wires connecting the chip to the asymmetrical stripline.

10. The multilayer printed circuit board of claim 9, wherein the chip is an MMIC.

11. The multilayer printed circuit board of claim 9, wherein the chip is disposed within the cavity.

12. The multilayer printed circuit board of claim 9, wherein the asymmetrical stripline is oriented in the same plane as the microstrip.

* * * * *